United States Patent [19]

Vasudev

[11] Patent Number: 4,617,066
[45] Date of Patent: Oct. 14, 1986

[54] PROCESS OF MAKING SEMICONDUCTORS HAVING SHALLOW, HYPERABRUPT DOPED REGIONS BY IMPLANTATION AND TWO STEP ANNEALING

[75] Inventor: Prahalad K. Vasudev, Santa Monica, Calif.

[73] Assignee: Hughes Aircraft Company, Los Angeles, Calif.

[21] Appl. No.: 674,623

[22] Filed: Nov. 26, 1984

[51] Int. Cl.$^4$ .................. H01L 21/263; H01L 21/225
[52] U.S. Cl. .......................................... 148/1.5; 29/571; 29/576 B; 148/187; 148/DIG. 24; 148/DIG. 61; 357/91
[58] Field of Search .................. 148/1.5, 187; 29/571, 29/576 B; 357/91

[56] References Cited

U.S. PATENT DOCUMENTS

| | | | |
|---|---|---|---|
| 3,653,977 | 4/1972 | Gale | 148/1.5 |
| 4,216,030 | 8/1980 | Graul et al. | 148/1.5 |
| 4,385,937 | 5/1983 | Ohmura | 148/1.5 |
| 4,391,651 | 7/1983 | Yoder | 148/1.5 |
| 4,420,870 | 12/1983 | Kimura | 29/571 |
| 4,434,013 | 2/1984 | Bol | 148/1.5 |
| 4,456,489 | 6/1984 | Wu | 148/1.5 |
| 4,463,492 | 8/1984 | Maeguchi | 29/576 B |
| 4,482,393 | 11/1984 | Nishiyama et al. | 148/1.5 |
| 4,498,224 | 2/1985 | Maeguchi | 29/571 |
| 4,502,205 | 3/1985 | Yahano | 29/576 B |
| 4,509,990 | 4/1985 | Vasudev | 148/1.5 |
| 4,523,370 | 6/1985 | Sullivan et al. | 29/576 B |
| 4,552,595 | 11/1985 | Hoga | 148/1.5 |

OTHER PUBLICATIONS

Sadana et al., J. Appl. Phys., 54, (1983) 3479.
Harrison et al., in Laser & Electron Beam Interactions in Solids, ed. Appleton et al., Elsevies, NY, 1982, p. 771.
Scovell et al., J. Appl. Phys., 54, (1983), 2413.

Primary Examiner—Upendra Roy
Attorney, Agent, or Firm—Victor G. Laslo; A. W. Karambelas

[57] ABSTRACT

A method for producing hyperabrupt P± or N± regions in a near-surface layer of a substantially defect free crystal, using solid phase epitaxy and transient annealing. The process for producing a hyperabrupt retrograde distribution of the dopant species begins with amorphizing the near-surface layer of a base crystal, and then implanting a steep retrograde distribution of the desired species into the amorphized layer, so that the retrograde distribution lies entirely within the amorphized layer, thereby avoiding channelling effects during implantation. The substantially defect-free structure of the base crystal is restored by annealing the implanted base crystal at a temperature sufficiently high to induce solid phase epitaxial regrowth on the underlying nonamorphized crystal, but at a temperature sufficiently low to avoid significant diffusion of the implanted species. The implanted species is subsequently activated by a rapid thermal annealing process, at a temperature sufficiently high to activate the implanted species, but for a very short time so that long-range diffusion does not occur. In a preferred embodiment, the implanted species is boron, $BF_2^+$, phosphorus, or arsenic in the top 0.20 micrometers of a substantially defect-free silicon base crystal, which may be in a bulk form or epitaxially deposited on an insulator substrate such as sapphire.

20 Claims, 4 Drawing Figures

PROCESS OF MAKING SEMICONDUCTORS HAVING SHALLOW, HYPERABRUPT DOPED REGIONS BY IMPLANTATION AND TWO STEP ANNEALING

BACKGROUND OF THE INVENTION

This invention relates generally to semiconductor devices, and, more specifically, to a semiconductor device having a very steep retrograde distribution of a rapidly diffusing species in a near-surface layer of a substantially perfect base crystal.

The proper operation of miniature electronic devices often depends significantly upon the ability to fabricate specialized forms of dopant layers within crystals. As an example, the fabrication of submicrometer CMOS integrated circuits using either bulk silicon or silicon-on-sapphire (SOS) substrates requires the fabrication of properly scaled submicrometer n- and p-channel MOS Field Effect Transistors (MOSFETs) with ultralow source and drain resistances, and minimal short channel behavior. The fabrication of such MOSFETs in turn necessitates the fabrication of dopant layers with high junction gradients, shallow junction depths, and ultralow sheet resistances.

The formation of P± and N± doped source and drain regions requires the formation of shallow, hyperabrupt distributions of ions such as boron, phosphorus, or arsenic in substantially perfect silicon crystals. In particular, the junctions of doped regions should lie within less than about 0.2 micrometers of the surface of the silicon crystal, and should include a retrograde junction having a gradient on the order of the solubility of the dopant species over a small distance, preferably about 0.01 micrometers. Further, when fabrication of the device is complete, the sheet resistance of the doped junction layer should be less than about 100 ohms per square, in turn requiring that the silicon base crystal be substantially free of defects and that the dopants be fully activated.

The fabrication of shallow junctions having steep concentration gradients, together with the requirement of low sheet resistance, poses difficult fabrication problems, so that such junctions have heretofore been impossible to prepare. In typical prior approaches, the dopant species was implanted into the surface of the silicon crystal under known and controlled conditions in an attempt to achieve the desired steep retrograde distribution, but the implanted crystal was then heated to elevated temperature to activate the implanted species and also to anneal the damage introduced by the implantation procedure, inasmuch as such damage increases the sheet resistance of the final device. This annealing procedure causes diffusion of the implanted species, which acts to reduce the steepness of the concentration gradient at the junction, and to cause migration of the junction to deeper depths within the crystal. Moreover, the implantation procedure and the annealing step can result in channelling of the implanted species, so that "tails" of high concentrations of the implanted species can be found along particular crystallographic directions in the base crystal following these procedures. Channelling effects tend to destroy the uniformity of the junction, also reducing the gradient and migrating the junction to deeper depths within the crystal.

Thus, in prior attempts to produce the necessary shallow junctions with steep concentration gradients, in a crystal having a low sheet resistance, the dopant ions were first implanted and then the crystal was annealed at a temperature of about 900°–950° C. for about 30–60 minutes. Athough the implantation procedure produces the desired dopant distribution to a first approximation, the distribution is imperfect because of the channelling tails and broadening due to the subsequent annealing procedure, as the junction migrates to deeper depths within the crystal and the sharpness of the concentration gradient at the junction is reduced. The resulting deep junctions can cause detrimental short channel behavior in submicrometer n- p-channel MOSFETs. The annealing procedure which causes the modification of the junction cannot be omitted, because the annealing process is required to activate the implanted species and to reduce the defect density in the base crystal for a sufficiently low sheet resistivity. For the case of SOS devices, the problem is further aggravated by the high defect density in the silicon film, which reduces dopant activation and enhances lateral diffusion under the gate of p-channel MOSFETs.

Thus, the fabricator of devices must reduce the defect density of the underlying base crystal to achieve the necessary low resistivities, but the conventional implanting and annealing procedure results in channelling of the implanted species and also broadening and deepening of the implanted junction. If the implanted species did not diffuse within the base crystal, the annealing treatment would not adversely modify the junction characteristics. Unfortunately, however, the dopant species of principal interest such as boron, phosphorus, and arsenic do diffuse rapidly within silicon base crystals at typical annealing and activation temperatures, and it has not been possible to prepare the desired junctions by prior procedures.

Thus, there has been proposed no fabrication procedure for producing hyperabrupt, shallow junctions of such dopants in base crystals, to yield a device having a low sheet resistivity. Accordingly, there exists a need for such a fabrication procedure. The process should allow the preparation of shallow, steep retrograde junctions of rapidly diffusing dopant species in base crystals, with the desired junction preserved through a treatment to reduce the defect concentration of the base crystal so that the sheet resistivity of the completed device is low. The fabrication procedure should be compatible with existing technology for producing microcircuits, and in particular should be compatible with further fabrication steps to add other components onto the chip. The present invention fulfills this need, and further provides related advantages.

SUMMARY OF THE INVENTION

The present invention provides a crystal having a shallow, steep distribution of a rapidly diffusing species, and a process for its preparation. The fabricated device exhibits a very low sheet resistivity, which may be five times lower than the sheet resistivities obtained by other techniques. Channelling and tailing effects during implanting and annealing are avoided, thereby preserving the uniformity and steep gradient of the junction. The process is fully compatible with existing semiconductor fabrication technology, and indeed is less costly because furnace annealing times and temperatures are reduced.

In accordance with the invention, a process for producing a controlled distribution of an activated, rapidly diffusing, implanted species within the near-surface layer of a base crystal comprises the steps of altering the near-surface layer of the base crystal from its normal structure to reduce the diffusivity and implant channelling of the implanted species, thereby forming a treated layer; implanting the implanted dopant species within the treated layer in the desired controlled distribution; reverting the base crystal of treated region to its normal crystalline structure; and activating the implanted species, thereby leaving the base crystal with the controlled distribution of the implanted species in an activated form, and with the base crystal substantially free of defects. More specifically, a steep retrograde distribution is achieved by amorphizing the near surface layer of the base crystal to produce an amorphized layer; implanting a steep retrograde distribution to lie substantially entirely within the amorphized layer, the step of implanting to occur at a temperature of the base crystal whereat the implanted species is essentially diffusionally immobile in the amorphized layer; annealing the base crystal at a first annealing temperature sufficiently high to achieve solid phase epitaxial growth in the amorphized layer on the crystalline portion of the base crystal, whereby the amorphized layer is recrystallized, the first annealing temperature being sufficiently low that the implanted species is substantially diffusionally immobile in the recrystallizing layer; and annealing the base crystal at a second annealing temperature greater than the first annealing temperature, for a time sufficient to activate the implanted species but not to permit large scale diffusion of the implanted species.

In a preferred embodiment, the silicon base crystal is amorphized to a depth of about 0.20 micrometers by implanting silicon ($Si^+$) or germanium ($Ge^+$) ions, the base crystal being held at liquid nitrogen temperature. The silicon ions are implanted in a two-step process, first at an energy of about 100 KeV with a dose of $2 \times 10^{15}$ ions per square centimeter, and, second, at an energy of about 55 KeV with a dose of about $2 \times 10^{15}$ ions per square centimeter. The dose current in each case is held below 0.2 microamps per square centimeter to prevent substrate heating. (Corresponding implantation values for germanium ions are, first, an energy of about 350 KeV with a dose of $2 \times 10^{15}$ ions per square centimeter, and, second, an energy of about 100 KeV with a dose of about $2 \times 10^{15}$ ions per square centimeter.) Boron, $BF_2^+$, phosphorus, or arsenic is then implanted under conditions such that the dopant retrograde distribution profile lies entirely within the amorphized layer, or below about 0.20 micrometers depth. The dosage level of the dopant is chosen to be close to its solid solubility at 1000° C. The substrate is held at a temperature low enough to prevent heating by the ion beam, preferably liquid nitrogen temperature. The implanted base crystal is then annealed at a temperature of from about 550° C. to about 650° C., preferably about 600° C. for 30 minutes, to achieve complete solid phase epitaxial growth of the amorphized layer on the underlying crystalline portion of the base crystal, thereby recrystallizing the amorphized layer to the low defect density required to achieve low sheet resistivities. The implanted crystal is then annealed a second time at a temperature of from about 1000° C. to about 1150° C., preferably about 1100° C. for about 1 second, to achieve activation of the implanted species. During this very brief high temperature annealing step, the implanted species is substituted into crystalline lattice sites, but does not have time to diffuse more than about one lattice spacing. Thus, the two annealing steps result in restoration of a substantially defect-free base crystal by recrystallization of the amorphized layer, and activation of the implanted species, without broadening or migration of the profile of the implanted species at the junction. The two-step annealing process is preferably accomplished in a transient annealing system using a bank of high power tungsten halogen arc lamps with a quartz diffuser, for producing a uniform intensity of optical radiation that is absorbed by the crystal.

After the annealing steps are complete, the processed component wafer is cooled down to about 500° C. within the heating apparatus and then is removed and placed on a cold surface to cool it rapidly but without causing wafer breakage or defect production. The wafer may then be further processed into device structures.

The present invention also extends to a crystal or wafer having a hyperabrupt junction therein comprising a base crystal substantially free of defects; and hyperabrupt retrograde distribution of an activated species contained in a near surface layer of the base crystal, the layer having a depth of no more than about 0.20 micrometers, the gradient of the retrograde distribution being at least as great as the difference bewteen the maximum solubility of the species and a substantially zero level over a distance of less than about 0.10 micrometers. The preferred base crystal is silicon, and the preferred activated species are boron, $BF_2^+$, phosphorus, or arsenic, all of which are rapidly diffusing species in silicon at the temperatures required for their activation in a silicon crystal.

It will now be appreciated that the present invention represents a significant and important advance in the preparation of microcircuit device structures. High concentration gradient, hyperabrupt retrograde junctions can be produced in the near-surface layers of crystals, from dopant species which are rapidly diffusing in the base crystal. After the dopant species is placed into a near surface amorphized layer of the base crystal, in the desired concentration distribution, this distribution is preserved and a substantially defect-free base crystal structure is produced by a two step annealing process, which also activates the dopant species. The resulting wafer has a high gradient, near surface retrograde distribution of the dopant species in a substantially defect free, low resistivity base crystal. The process for producing this structure is fully compatible with other device fabrication technology, and actually results in lower cost because of the reduced furnace capacity requirements. Other features and advantages of the invention will become more apparent from the following detailed description, taken in conjunction with the accompanying drawings, which illustrate, by way of example, the principles of the invention.

DETAILED DESCRIPTION OF THE PREFERRED EMBODIMENT

Figure 1:
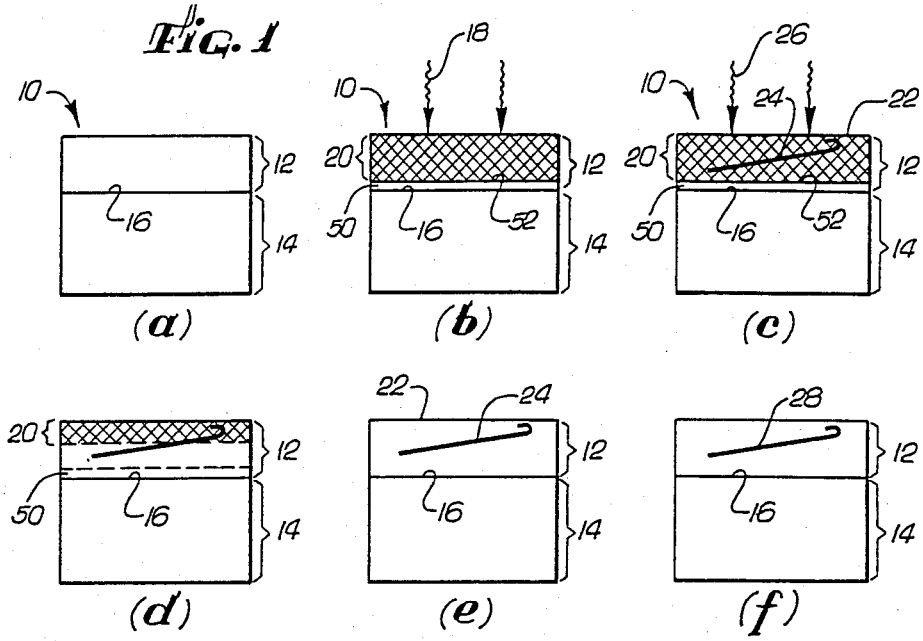
FIGS. 1(a)–1(f) is a series of side sectionals views of a base crystal illustrating the changes in its structure during processing.

In one preferred embodiment prepared in accordance with the present invention, a silicon on sapphire wafer 10 such as shown in FIG. 1(a) is used as the starting point. The silicon on sapphire wafer 10 comprises a silicon layer 12 epitaxially deposited on the suface of a sapphire substrate 14. Procedures for preparing such a wafer 10 are known in the art. See U.S. Pat. Nos. 3,508,962 and 3,546,936, whose disclosures are herein incorporated by reference. Briefly, the sapphire substrate 14 is preferably on the order of about 0.25–0.40 millimeters in thickness and has a surface crystallographic orientation of within about 1 degree of ($\bar{1}102$) (hexagonal Miller indices notation). This crystallographic orientation of the sapphire substrate 14 is necessary for the subsequent epitaxial growth of the silicon layer 12 having a preferred crystallographic orientation of (100) (cubic Miller indices notation).

The silicon layer 12 is deposited on the surface of the sapphire substrate 14, preferably by chemical vapor deposition. The chemical vapor deposition of the epitaxial silicon layer 12 is preferably performed by the chemical decomposition of silane ($SiH_4$) in an appropriate reactor at approximately 910° C. In the preferred embodiment, the epitaxial growth is performed to achieve a silicon epitaxial layer 12 having a maximum thickness of about 0.25 micrometers with a growth rate range of from about 0.3 to about 2.4 micrometers per minute, preferably 2.4 micrometers per minute. This preferred growth rate minimizes the defect density in the silicon layer 12 at a silicon-sapphire interface 16. Such wafers 10 may be obtained commercially from the Crystal Products Division of Union Carbide, Inc., 8888 Balboa Avenue, San Diego, Calif. 92123.

The silicon on sapphire wafer 10 is utilized herein as the starting material for a preferred embodiment of the present invention, with the silicon layer 12 serving as the base crystal for preparation of the doped junction prepared in accordance with the invention. However, the present invention is more broadly applicable to preparation of a wide variety of doped junctions in base crystals, such as, for example, bulk silicon, gallium arsenide, silicon on alpha-aluminum oxide (as disclosed in U.S. Pat. No. 3,393,088), silicon on spinel insulators (as disclosed in U.S. Pat. No. 3,414,434), silicon on chrysoberyl (as disclosed in U.S. Pat. No. 3,475,209), and IIb–VIa and III–V semiconductor compounds on insulator substrates (as disclosed in U.S. Pat. No. 3,664,866), all of the disclosures of the listed patents being incorporated herein by reference. Moreover, the base crystal need not be pure, but may be a compound or previously doped with other species. However, to achieve the preferred embodiment having minimum resistivity, the base crystal is preferably of very high purity. Nonetheless, the principles of the present invention are applicable to impure base crystals to achieve desired dopant profile concentrations therein.

In accordance with the present invention, the base crystal, herein the silicon layer 12, is first treated by amorphizing to modify its normal crystalline structure to an amorphous structure, which reduces the diffusivity and implant channelling of a subsequently implanted species. Referring to FIG. 1(b), amorphizing is accomplished by implanting ions 18, preferably $Si^+$ or $Ge^+$ ions, into the wafer 10 to amorphize the silicon layer 12. Where the wafer 10 is the illustrated SOS material, the amorphizing implantation may be conducted at ambient or lower temperatures, but the amorphizing implantation should be conducted at reduced temperatures such as liquid nitrogen temperature when bulk silicon is used. The amorphizing ion implantation is preferably conducted in two steps involving two different sets of implantation conditions. For $Si^+$, in the first step the preferred implantation energy is about 100 KeV with a dose of about $2\times10^{15}$ ions per square centimeter, and, in the second step, the preferred implantation energy is about 55 KeV with a dose of about $2\times10^{15}$ ions per square centimeter. For $Ge^+$, in the first step the preferred implantation energy is about 350 KeV with a dose of $2\times10^{15}$ ions per square centimeter, and, in the second step, the preferred implantation energy is about 100 KeV with a dose of about $2\times10^{15}$ ions per square centimeter. For both species, the dosage current is maintained below about 0.2 microamps per square centimeter, also chosen to prevent substrate heating, which could prematurely anneal the amorphized layer. Amorphization under these conditions for a time of about 60 minutes produces an amorphized layer 20 having a depth of about 0.20 micrometers. Thus, in this preferred embodiment the depth of the amorphized layer 20 is somewhat less than the thickness of the silicon layer 12, but the amorphized layer 20 could be of substantially equal thickness to that of the silicon layer 12. If the amorphization is conducted on a bulk silicon crystal, there is no substrate of different composition, and the implantation depth may be chosen as any convenient value.

In performing the amorphization, it is strongly preferred that the implantation energy and ion dose be sufficiently low so as not to exceed the damage density threshold of the sapphire substrate 14. If this threshold were exceeded during formation of the amorphous layer 20, the portion of the sapphire substrate 14 adjacent the interface 16 may become damaged. Such damage is believed to produce a mobile species containing aluminum in the sapphire substrate 14, which can later diffuse as a contaminant into and throughout the silicon layer 12 during annealing treatments, with the result that the resistivity of the completed device is substantially increased. The implantation conditions stated previously are sufficient to avoid damage to the near-interface region of the sapphire substrate 14. Where the starting material is pure bulk silicon, this problem area does not arise. For other composite starting materials, such as those mentioned previously, the same principle of avoiding damage to the underlying substrate is to be applied to avoid possible contamination of the amorphized base crystal.

Next, a desired dopant species 26 is implanted into the amorphized layer 20 in the desired distribution, using implantation conditions which prevent modification of the amorphized layer 20. In the preferred embodiment, the desired distribution is a steep retrograde distribution of the implanted dopant species, the term "retrograde distribution" indicating that the concentration of the dopant species near the interface 16 is less than the concentration nearer to the base crystal surface 22. A retrograde distribution is illustrated by the retrograde distribution curve 24 in FIG. 1(c). It is important that the desired distribution be implanted entirely within the amorphized layer 20, to avoid channeling and so that the characteristics of the distribution are preserved through the later processing steps.

In this preferred embodiment, the dopant species 26 is preferably selected from the group consisting of boron, $BF_2^+$, phosphorus, and arsenic. Techniques for implanting such species are known in the art. When implanted under the conditions indicated below, the peak of the distribution 24 is within about 0.005 to about 0.010 micrometers of the crystal surface 22, and the maximum concentration of dopant species can be near the limit of solid solubility. For implanted boron, for example, the implanted concentration is about 3 to $5 \times 10^{20}$ atoms per cubic centimeter, with the concentration falling to the range of about $10^{16}$ to about $10^{17}$ atoms per cubic centimeter over a distance of about 0.020 micrometers further into the crystal base from the peak. In the preferred embodiment, it is desired that the gradient or slope of the retrograde distribution 24 be as great as possible, and therefore the maximum dopant concentration is chosen to be close to the maximum solubility of the dopant species in the base crystal at a second annealing temperature, whose selection will be described in more detail below. The following table presents the preferred implantation conditions for each of the preferred dopant species.

| Ions | Implantation Energy in KeV | Dose In Ions Per Square Centimeter |
|---|---|---|
| Boron | 10 | $2-4 \times 10^{15}$ |
| $BF_2^+$ | 45 | $2-4 \times 10^{15}$ |
| Phosphorus | 55 | $2-4 \times 10^{15}$ |
| Arsenic | 100 | $2-4 \times 10^{15}$ |

Dose current to be less than about 0.2 microamps per square centimeter.

As indicated previously, it is important that the entire dopant distribution 24 be contained within the amorphized layer 20. In typical ion implantation treatments into a nonamorphized, crystalline layer, the implanted species is channelled along particular crystallographic orientations of the base crystal to produce "tails" along the channelled crystallographic directions. The tails produce spikes or protrusions from the distribution into deeper layers of the base crystal, so that the front of the distribution 24 becomes irregular along the channelled crystallographic directions. This irregularity is highly undesirable in producing a sharp demarcation at the junction interface along the distribution 24. By contrast, an amorphized layer does not contain preferred crystallographic orientations or directions to allow channelling of the implanted species during implantation, and therefore the spacial uniformity and sharp front of the distribution 24 are maintained. Although thermally activated diffusion of the implanted species is greater in an amorphized layer than in a crystalline layer at any particular temperature, during implantation the wafer 10 is held at liquid nitrogen temperatures to avoid the possibility of substantial thermally activated diffusion. Thus, properly performed implantation of the dopant species 26 into an amorphized base crystal 20 at low temperatures results in a sharply defined distribution, in this case the retrograde distribution 24.

Next, it is necessary to restore the crystallinity of the amorphized layer 20 and to activate the implanted species 26. The electrical resistivity of the amorphized layer 20 is much greater than that of the same layer when in a crystalline form, such as the initially deposited epitaxial silicon layer 12. As illustrated in FIGS. 1(d) and 1(e), the amorphized layer 20 may be recrystallized back to epitaxial, fully crystalline layer 12 by annealing the wafer 10. Annealing is accomplished by heating the wafer 10 to a temperature sufficiently high to achieve solid state epitaxial growth in the amorphized layer 20 on the crystalline portion of the underlying base crystal. As used herein, the term "crystalline portion of the base crystal" may refer to epitaxial growth on a nonamorphized, crystalline portion of the silicon layer 12, or it may refer to epitaxial growth on the underlying sapphire substrate 14. In the embodiment described herein, because only the near surface region 20 of the silicon layer 12 was amorphized, the epitaxial recrystallization of the amorphized layer 20 occurs on the underlying nonamorphized crystalline silicon layer 50, and constitutes upward epitaxial growth from an interface 52 between the amorphized layer 20 and the crystalline silicon layer 50. FIG. 1(d) illustrates the annealing operation at an intermediate stage, wherein the recrystallization has initiated at the interface 52 and moved toward the surface 22 through the amorphized layer 20. As the recrystallization progresses, the amorphized layer 20 is consumed and converted to its crystalline form 12, leaving the silicon layer 50 and the sapphire substrate 14 unchanged. Upon completion of this recrystallization annealing treatment as illustrated in FIG. 1(e), the wafer 10 is again fully crystalline, having the sapphire substrate 14, the substantially defect free silicon epitaxial layer 12, and the retrograde distribution 24 of implanted dopant species lying within the substantially defect free silicon epitaxial layer 12.

The first annealing temperature used in this recrystallization annealing step is chosen to be sufficiently high to recrystallize the amorphous region 20, but sufficiently low so that the implanted species 26 is substantially immobile by thermally activated diffusion in both the amorphized layer 20 and the silicon layer 12. Since the preferred dopant species 26 are generally rapidly diffusing in the amorphous layer 20 and the silicon layer 12, it is important that this first annealing temperature not be set at too high a level. It has been found that this first annealing temperature is preferably from about 550° C. to about 650° C., most preferably 600° C. for a period of time of about 30 minutes.

The implanted species is then electrically activated by annealing the base crystal at a second annealing temperature greater than the first annealing temperature and sufficiently high to cause electrical activation of the implanted dopant species. When the dopant species is implanted, the ions come to rest at random locations in relation to the silicon atoms in the amorphous layer 20. In the first or recrystallization anneal, the silicon atoms assume a crystallographic lattice in forming the crystalline silicon layer 12. However, the implanted dopant atoms remain substantially in their original implanted positions, and thence in a random, undefined relationship to the lattice points of the silicon crystal 12. For proper operation of the subsequently produced device, the implanted dopant species 26 must be substituted onto silicon lattice points in place of silicon atoms. This substitution is essentially a thermal diffusional process wherein the dopant species ions diffuse one atomic lattice spacing or less. Thus, to achieve electrical activation the implanted species 26 must be thermally activated to a sufficiently high energy that the atoms can substitutionally jump into the silicon lattice sites. However, the implanted dopant species 26 must not be thermally energized so much that it moves substantially more than one atomic lattice spacing, as such larger scale diffusional movement would alter the desired retrograde distribution 24 by broadening the distribution and causing it to migrate to greater depths within the silicon layer 12.

Figure 2:
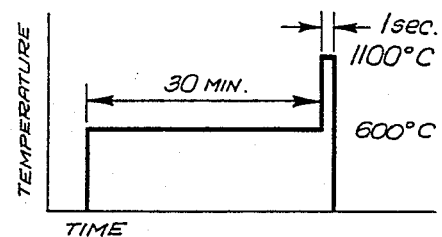
FIG. 2 is a graph illustrating a two step annealing procedure.

Preferably, activation is achieved by a rapid transient anneal of the wafer 10 using optical radiation, to produce an activated distribution 28, as illustrated in FIG. 1(f). The activated distribution 28 is essentially identical with the implanted distribution 24 in shape and location within the silicon layer 24, but the atoms in the distribution 28 may be displaced by a silicon lattice spacing or less to lie on the silicon crystal lattice points. Activation is achieved by heating the wafer 10 to a very high temperature for a very short time by any suitable technique. Preferably, the selected annealing technique allows the combining of the first and second annealing steps in a single apparatus, although the two annealing steps themselves remain uniquely defined within the apparatus. FIG. 2 illustrates a preferred "waveform" for the annealing process. Although the first annealing and the second annealing are shown as continuous, they may be made intermittent and broken into two distinct portions by an intermittent cooling to a lower temperature, although intermittent cooling is not preferred because of the possibility of inducing crystal defects into the wafer 10 by the creation of thermal strains.

Figure 3:
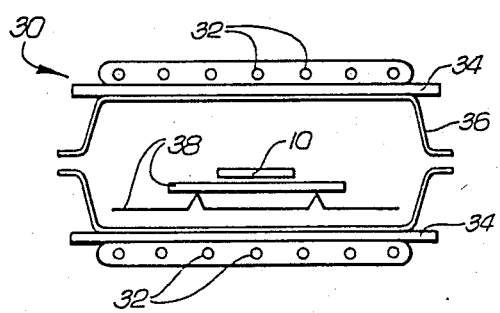
FIG. 3 is a schematic side sectional view of a transient annealing system.

Annealing is preferably performed by a transient anneal furnace 30 illustrated in FIG. 3. The furnace 30 consists of two banks of high power arc lamps 32, such as tungsten, mercury or quartz halogen lamps of about one kilowatt power level, with a quartz diffuser 34 placed between the arc lamps 32 and a closed chamber 36. The chamber 36 contains a support 38, upon which the wafer 10 rests during the annealing treatment. Both of the annealing steps may be accomplished in the furnace 30, with the arc lamps 32 adjusted to a first power level to achieve the first annealing temperature, and then quickly readjusted to a second, higher power level for a very short time to achieve the second annealing step. Both annealing steps are preferably accomplished in a flowing inert atmosphere such as argon or nitrogen gas.

For the preferred dopant species 26, the second annealing is preferably accomplished in the range of about 1000°-1150° C., most preferably 1100° C. for about 1 second. This very high temperature, very short time annealing treatment achieves activation of the dopant species 26, but the time of exposure at the high temperature is not sufficiently great for thermally activated diffusion to occur over long ranges of more than about one lattice spacing.

The two-step annealing process using optical radiation of the present invention is to be contrasted with the single step approach of the prior art. In the prior approaches, it was attempted to anneal implantation damage from an implanted region at the same time that the implanted dopant species was electrically activated. To achieve the electrical activation, the selected annealing temperatures were so high that the entire implanted distribution was broadened and diffused to greater depths within the base crystal. By contrast, in the present invention the two step annealing process is utilized in recognition of the two separate functions performed by annealing. In the first annealing step of the present invention, the substantially defect free crystalline structure of the silicon layer 12 is restored by recrystallization of the amorphized layer 20. This thermal annealing restores the low resistivity of the substantially defect free silicon layer 12, but is conducted at a sufficiently low temperature that thermally activated diffusion of the implanted species 26 cannot occur. However, such very low annealing temperatures cannot electrically activate the implanted species 26. The second annealing step is conducted at a sufficiently high temperature to achieve this electrical activation, but the second annealing step is so brief that the activated dopant species cannot diffusionally migrate distances substantially greater than one lattice spacing of the silicon crystal, so that the implanted distribution 24 neither broadens nor migrates to greater depths within the base crystal. It is to be noted that the desired annealing profile such as that illustrated in FIG. 2 can be achieved by other, carefully controlled techniques such as electron beam heating using the approach described herein.

After the two step annealing procedure is completed, the wafers 10 are cooled down to about 500° at a rate of about 10° C. per minute in the controlled atmosphere of the chamber 36. The wafers 10 are then removed and placed on a cold surface to rapidly cool them to ambient temperature. However, the wafers 10 are not quenched at a high rate which might break the wafer 10, or produce high thermal strains which could induce defects in the wafer 10, which would increase the electrical resistivity of the wafer 10.

Hyperabrupt adjunctions having structure and characteristics previously unobtainable have been produced in accordance with the present invention. Such a wafer comprises a silicon base crystal, either in bulk form or on a substrate, which is substantially free of defects in the electronic sense, and a hyperabrupt retrograde distribution of an activated species contained in the near surface region of the base crystal, wherein the near surface region has a depth of no more than about 0.20 micrometers. The implanted species are selected from those previously mentioned, boron, $BF_2^+$, phosphorus, or arsenic. The gradient of the retrograde distribution is determined by the implanted profile, and is at least as great as the difference between the maximum solubility of the species and the zero level, this difference to be obtained over a distance of less than about 0.10 micrometers in depth of the crystal. The peak of the distribution is at a depth as low as about 0.005 to 0.010 micrometers, and the retrograde gradient is as high as the difference between the maximum solid solubility of the dopant species and a level of substantially zero (i.e., a decrease of four orders of magnitude) over a distance of 0.100 micrometers or less, and typically over a distance of 0.020 micrometers. Such a wafer has a sheet conductivity of less than about 100 ohms per square, and in particular, sheet resistivities as low as about 60 ohms per square have been obtained. Such shallow junction depths and low sheet resistivities have not been previously obtainable by conventional techniques.

In most instances, the wafers produced in accordance with the present invention are not used in their as-fabricated form in devices. Instead, the fabricated wafers as described herein are used as the starting point for the fabrication of FETs and other devices, to form integrated circuits. The process decribed herein may also be used as an intermediate subprocess in a more complex device fabrication procedure, as will be described next.

Figure 4:
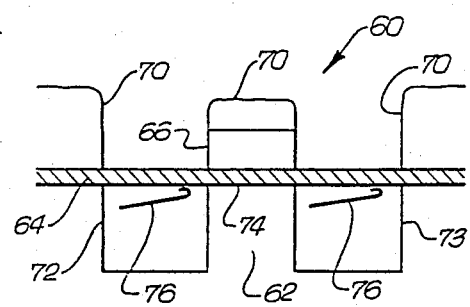
FIG. 4 is a side sectional view of an integrated circuit structure having self-aligned MOSFET devices, prepared in accordance with the present invention.

The process described herein has been used successfully in fabricating self-aligned integrated circuit devices. The basic approach to preparing such devices is shown in the art and is described in U.S. Pat. Nos. 3,472,712; 3,615,934; and 3,507,709, whose disclosures are herein incorporated by reference. A preferred form of self-aligned device 60 prepared in accordance with the present invention is illustrated in FIG. 4. A base crystal 63 upon which the device is fabricated may be either pure bulk silicon or silicon on sapphire. A layer 64 of $SiO_2$ is thermally grown on the base crystal to a thickness of about 0.02 micrometers. An N+ doped polysilicon contact 66 is then deposited onto the $SiO_2$ layer 64 as an electrical contact to the $SiO_2$ gate layer 64. Next, a mask 68 is applied so as to leave two openings 70 therethrough, the openings 70 being adjacent to, but laterally displaced from, the contact 66.

The N+ source region 72 and drain region 73 are formed with a shallow, hyperabrupt junction, preferably by a slight modification of the previously described process. The process is modified only to the extent of changing the amorphizing and implanting conditions to account for the presence of the layer 64, which generally requires slightly higher implantation voltages. The source 72 and drain 73 are first amorphized by a two-step implantation of $Si^+$ ions, first at an energy of 140 KeV and dose of $2 \times 10^{15}$ ions per square centimeter and second at an energy of 25 KeV and dose of $2 \times 10^{15}$ ions per square centimeter. The amorphized layer so produced is about 0.200 micrometers in depth, below an interface 74 between the $SiO_2$ layer 64 and the base crystal 72.

Next a dopant species is implanted in a retrograde distribution 76, the preferred dopant species being boron, $BF_2^+$, phosphorus, or arsenic. The preferred implantation conditions are listed in the following table.

| Ions | Implantation Energy in KeV | Dose In Ions Per Square Centimeter |
| --- | --- | --- |
| Boron | 20 | $2-4 \times 10^{15}$ |
| $BF_2^+$ | 53 | $2-4 \times 10^{15}$ |
| Phosphorus | 62 | $2-4 \times 10^{15}$ |
| Arsenic | 120 | $2-4 \times 10^{15}$ |

Dose current to be less than about 0.2 microamps per square centimeter.

It will be noted that the implantation energies are adjusted to be slightly higher than those disclosed previously, to allow implantation through the $SiO_2$ layer 64. As implanted, the peak of the distribution 76 is about 0.025 micrometers below the upper surface of the $SiO_2$ layer 64, or about 0.005 micrometers below the interfere 74. The concentration of the implanted dopant species falls about four orders of magniture over a depth of about 0.020 micrometers. This combination of a shallow, hyperabrupt dopant distribution has heretofore been unobtainable, but is critical to the development of devices having submicron gate lengths. The mask 70 is removed by standard procedures. The device 60 is next annealed by the two-step process described previously, preferably at 600° C. for 30 minutes and at 1100° C. for 1 second. Finally, electrical contacts are applied. These device fabrication steps are readily conducted intermediate in the fabrication of integrated circuits involving many steps, and are fully compatible with such conventional technology.

The present invention thus provides an important advance in the technology of fabricating integrated circuit devices. Controlled distributions of rapidly diffusing implanted species can be produced in a substantially defect-free base crystal. In particular, steep, hyperabrupt retrograde junctions can be produced in substantially defect free silicon base crystals, either in their bulk form or as epitaxially deposited on substrates. Although a particular embodiment of the invention has been described for purposes of illustration, various modifications may be made without departing from the spirit and scope of the invention. Accordingly, the present invention is not to be limited except as by the appended claims.

What is claimed is:

1. A process for preparing a shallow, hyperabrupt interface between an undoped layer and a layer doped with a rapidly diffusing, activated species, in a crystalline near-surface layer of a base crystal, comprising the steps of:

amorphizing the near-surface layer of the base crystal to produce an amorphized layer of the underlying base crystal;

implanting a steep retrograde distribution of a rapidly diffusing implanted species into the amorphized layer, the retrograde distribution residing substantially entirely within the amorphized region, said step of implanting to occur at a temperature of the base crystal whereat the implanted species is essentially diffusionally immobile in the amorphized layer;

annealing the base crystal at a first annealing temperature sufficiently high to achieve solid phase epitaxial growth in the amorphized layer on the crystalline portion of the base crystal, whereby the amorphized layer is recrystallized, the first annealing temperature being sufficiently low that the implanted species is substantially diffusionally immobile in the recrystallizing layer; and annealing the base crystal at a second annealing temperature greater than the first annealing temperature, for a time sufficient to activate the implanted species but not to permit large scale diffusion of the implanted species, thereby producing a shallow, hyperabrupt interface in the crystalline near-surface region of the base crystal.

2. The process of claim 1, wherein the base crystal is silicon.

3. The process of claim 1, wherein the implanted species is selected from the group consisting of boron, $BF_2^+$, phosphorus, and arsenic.

4. The process of claim 1, wherein the maximum concentration of the implanted species is about the maximum solubility of the implanted species at the second annealing temperature.

5. The process of claim 1, wherein the amorphized layer is about 0.20 micrometers in thickness.

6. The process of claim 1, wherein the first annealing temperature is from about 550° C. to about 650° C.

7. The process of claim 1, wherein the second annealing temperature is from about 1000° C. to about 1150° C.

8. The process of claim 1 wherein said step of amorphizing the near-surface layer further comprises implanting germanium ions.

9. The process of claim 1 wherein the step of implanting further comprises a first and second step of implanting ions so as to damage said base crystal structure with said first step of implanting occurring at a first energy and dose current and said second step of implanting ions occurring at a second energy and dose current.

10. The process of claim 8 wherein said step of amorphizing is accomplished using an ion dose current of less than 1 microamp per square centimeter.

11. The process of claim 9 wherein said ions comprise silicon or germanium.

12. A process for producing a controlled distribution of an activated, rapidly diffusing, implanted species within the near-surface layer of a base crystal, comprising the steps of:
   damaging the near-surface layer of the base crystal to alter its normal structure to reduce the diffusivity and implant channelling of the implanted species, thereby forming a treated layer;
   implanting the implanted species within the treated layer in said desired controlled distribution;
   recrystallizing the base crystal of the treated layer to its normal crystalline structure; and
   activating the implanted species, thereby leaving the base crystal with the controlled distribution of the implanted species in an activated form.

13. The process of claim 12, wherein said step of damaging includes amorphizing the near-surface layer.

14. The process of claim 12, wherein the controlled distribution is a hyperabrupt retrograde distribution.

15. The process of claim 12, wherein the step of recrystallizing includes heating the base crystal at a first annealing temperature to cause solid phase epitaxial growth of the treated layer.

16. The process of claim 12, wherein the step of activating includes heating the base crystal to a second annealing temperature.

17. A process for producing a hyperabrupt retrograde distribution of an implanted species in a silicon base crystal, comprising the steps of:
   amorphizing a depth of about 0.20 micrometers of the silicon crystal;
   implanting the dopant species selected from the group consisting of boron, $BF_2^+$, phosphorus, and arsenic so that a retrograde distribution of the dopant species lies entirely within the amorphized layer;
   annealing the implanted base crystal at a temperature of from about 550° C. to about 750° C. to achieve solid phase epitaxial growth; and
   annealing the implanted base crystal at a temperature of from about 1000° C. to about 1150° C. to achieve activation of the implanted species.

18. The process of claim 17, wherein the first annealing is conducted at a temperature of about 600° C. for a time of about 30 minutes.

19. The process of claim 17, wherein the second annealing is conducted at a temperature of about 1100° C. for a time of about 1 second.

20. The process of claim 17, wherein said amorphizing step is accomplished by implanting $Si^+$ ions.

* * * * *